United States Patent [19]

Tanski

[11] 4,364,016

[45] Dec. 14, 1982

[54] METHOD FOR POST FABRICATION FREQUENCY TRIMMING OF SURFACE ACOUSTIC WAVE DEVICES

[75] Inventor: William J. Tanski, Maynard, Mass.

[73] Assignee: Sperry Corporation, New York, N.Y.

[21] Appl. No.: 202,951

[22] Filed: Nov. 3, 1980

[51] Int. Cl.³ .................. H03H 3/08; H03H 9/25; H03H 9/42; H03H 9/64

[52] U.S. Cl. .................. 333/193; 29/25.35; 333/150; 333/154

[58] Field of Search ................ 333/150–155, 333/193–196; 310/313 R, 313 A, 313 B, 313 C, 313 D; 324/56; 29/25.35

[56] References Cited

U.S. PATENT DOCUMENTS 4,210,883 7/1980 Shaw et al. .................. 333/195
4,278,492 7/1981 Cross et al. .................. 324/56 X

OTHER PUBLICATIONS

Bell, Jr. et al.—"Surface-Acoustic-Wave Resonators", Proc. of the IEEE, vol. 64, No. 5, May 1976; pp. 711–721.
Staples et al.—"Saw Resonator 2-Pole Filters", Proc. 34th Annual Frequency Control Symposium, USA-ERADCOM, Ft. Monmouth, May 1980; pp. 273–277.

Primary Examiner—Marvin L. Nussbaum
Attorney, Agent, or Firm—Howard P. Terry; Terry J. Ilardi

[57] ABSTRACT

A method for trimming the resonant frequency of fabricated SAW devices. The resonant frequency of SAW devices of the type having a substrate with structures made of a second material, other than the substrate material, upon its surface, is decreased by removing quantities of the substrate material until the desired change in frequency is obtained. In one embodiment, the substrate material of the SAW device is removed by etching the substrate in a fluorocarbon plasma, which leaves the structure made of the second material substantially unchanged. In a second embodiment, the resonant frequency of SAW resonators is increased by heating the SAW device at a temperature in excess of 250° C. until the desired change in resonant frequency is obtained.

2 Claims, 11 Drawing Figures

METHOD FOR POST FABRICATION FREQUENCY TRIMMING OF SURFACE ACOUSTIC WAVE DEVICES

BACKGROUND OF THE INVENTION

1. Field of the Invention

The present invention relates generally to the field of surface acoustic wave devices. More particularly, it relates to the precision adjustment of the resonance frequency of surface acoustic wave devices.

2. Description of the Prior Art

Surface acoustic wave delay line type filters may be fabricated to be operable at frequencies up to 2500 megahertz and resonator type filters have been fabricated that are operable to 1500 megahertz with Q values approaching the material limits. For SAW filters, to be useful as systems components, it is essential to be able to precisely set the resonant and synchronous frequencies of these devices. Although careful manufacturing methods will enable these resonant frequencies to be set within 0.01% of the frequency desired, for many applications this is not sufficiently accurate.

Conventional trimming techniques suffer from various shortcomings. In one method known in the art, a rectangular gold film is placed in the cavity of a resonator, and then selectively etched, thereby increasing the velocity of the surface acoustic waves and hence the resonant frequency of the device. This method is complex, and due to the large cavity area required, only useful for low frequency devices.

In a second technique, high energy ions are implanted in the surface of the SAW device, causing amorphisation of the quartz surface with a reduction in mass loading due to swelling. Ion implantation, however, results in increased device aging rates; furthermore, ion implantation equipment is expensive and generally not readily available.

The present invention, directed to methods for frequency trimming SAW devices, provides simple processes that do not result in undue device aging, are useful for devices of any frequency, and do not require equipment that is expensive or not readily available.

SUMMARY OF THE INVENTION

The present invention provides a method for trimming the resonant frequency of surface acoustic wave devices.

The trimming method embodying the principles of the present invention for decreasing the resonant frequency of SAW devices having a substrate and structures thereon fabricated from different materials, comprises selectively etching the substrate material until sufficient substrate material has been removed to effect the desired frequency decrease.

The etching process may be beneficially accomplished for devices having structures comprised of aluminum and a substrate comprised of quartz by plasma etching, wherein the plasma is generated from a fluorocarbon gas.

The trimming method embodying the principles of the present invention for increasing the resonant frequency of SAW devices comprises heating the SAW device to a temperature in excess of 250° C. for a length of time that has been predetermined to provide the desired change in the device resonant frequency. This method accomplishes an increase in resonant frequency through a process of annealing and is useful for, among others, devices having quartz substrates and aluminum structures, such as transducers and resonators thereon.

DESCRIPTION OF THE PREFERRED EMBODIMENT

Figure 1:
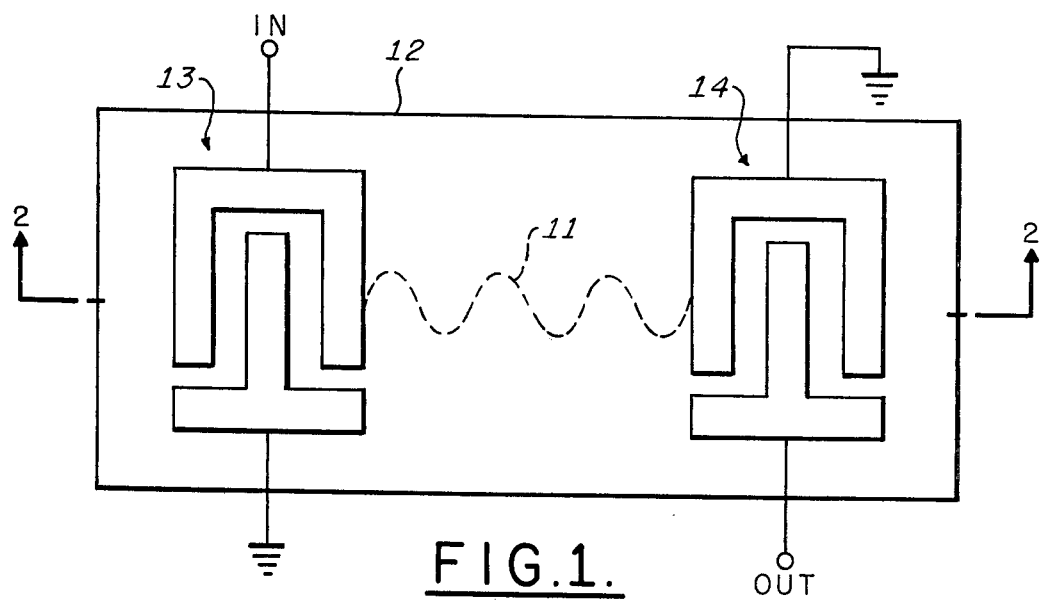
FIG. 1 shows a view of a SAW device.
Figure 2:
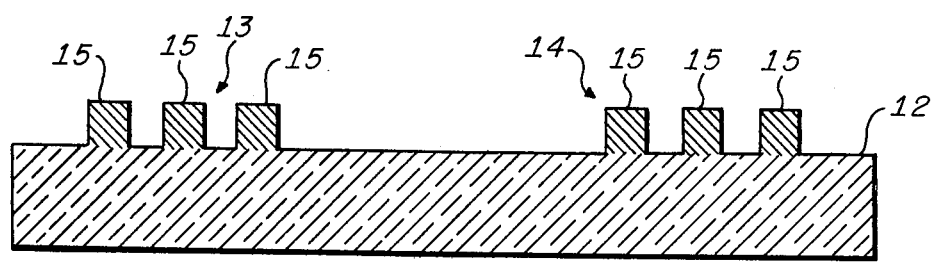
FIG. 2 shows a cross-sectional view of the SAW device of FIG. 1 before trimming.
Figure 3:
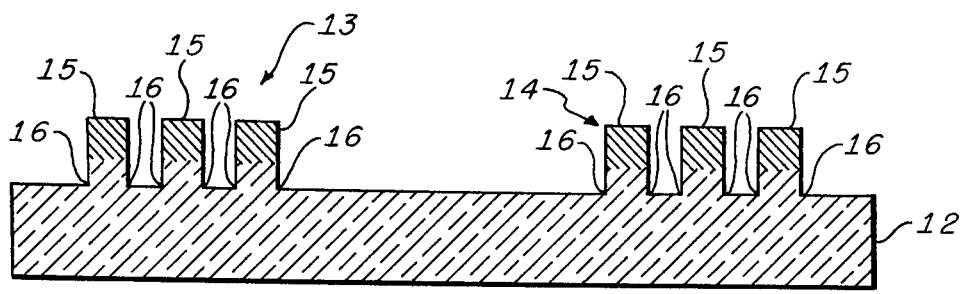
FIG. 3 shows a cross-sectional view of the SAW device of FIG. 1 after trimming.

Refer to FIG. 1 wherein a SAW delay line type filter 10 is shown. In operation, the surface acoustic wave 11 propagates along the surface of the quartz substrate 12, between the aluminum interdigital transducers 13 and 14. FIG. 2 is a cross-sectional view taken through section A—A of the SAW device shown in FIG. 1. Aluminum interdigital transducers 13 and 14 may comprise a plurality of electrodes 15 deposited on the surface of the quartz substrate 12, having a predetermined height relative to the surface of the quartz substrate, and having a predetermined spacing from one another. In the method for reducing the characteristic frequency of the SAW device, the geometric structure of the device is modified by removing a layer like portion of those areas of the substrate material 12 that are not covered by the aluminum transducers 13 and 14, while leaving the aluminum electrodes 15 substantially undisturbed. This may be accomplished by using a selective etching technique that selectively etches quartz, yet does not substantially etch aluminum, as will be described in detail below. As a result, the height of the transducer electrodes 15 relative to the substrate 12 is changed as shown in FIG. 3.

Figure 4:
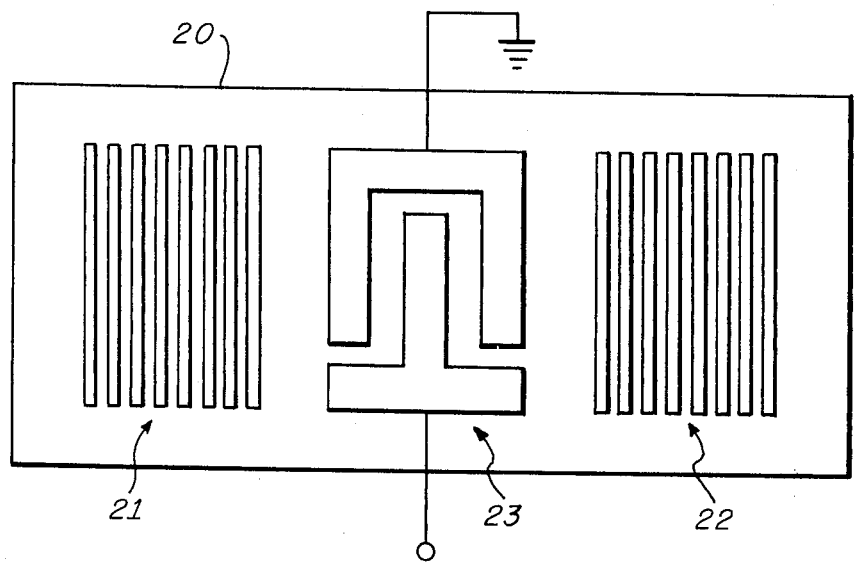
FIG. 4 shows a simplified drawing of a SAW resonator.
Figure 5:
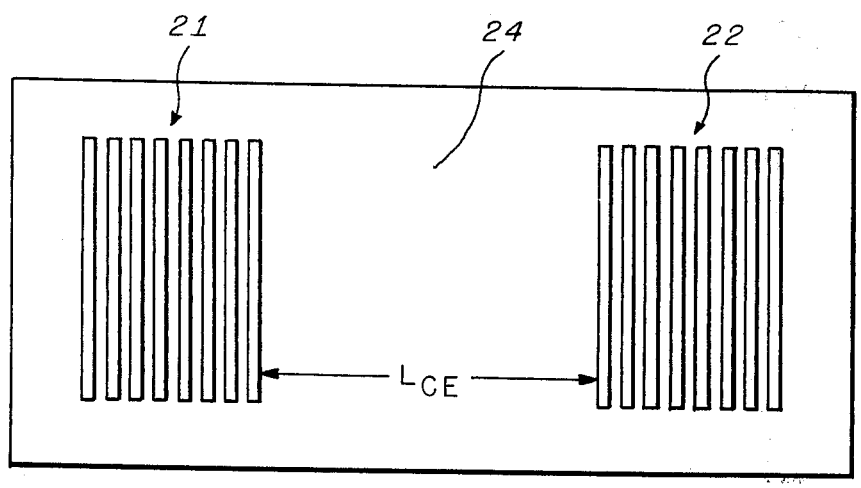
FIG. 5 shows the device of FIG. 4 without a transducer.

The change in height of the transducer relative to the substrate decreases the characteristic frequency of the SAW device as a result of two distinguishable but interrelated effects; namely, a change in the surface acoustic wave velocity, and a change in the reflectivity of the surface acoustic wave device transducers. In delay line type filters the surface acoustic wave velocity change reduces the synchronous frequency of the device. In resonator type filters the frequency change is more complicated and is better understood by reference to FIG. 4 wherein is shown a surface acoustic wave resonator comprising a quartz substrate 20 upon which a cavity defined by the location of reflectors 21 and 22, is located. Interdigital transducer 23, is placed within the cavity and may be used to generate surface acoustic waves therein. The generated surface acoustic waves will be reflected to and from each reflector, allowing standing waves to set up within the cavity. The resonance frequency $f_r$ of SAW resonators may also be changed by using the selective etching technique. FIG. 5 shows a similar SAW resonator having no transducers present, but having reflectors 21 and 22 forming cavity 24, which has a length denoted as $L_{ce}$. In such a device resonance will take place when the round-trip phase change of a surface acoustic wave reflected twice within the cavity is a multiple of $2\pi$ according to the following:

$$2K_r L_{ce} - 2\phi_r = 2M_o \pi \quad (1a)$$

or $$K_r L_{ce} - \phi_r = M_o \pi \quad (1b)$$

where
$K_r$ = the resonant wave number = $2\pi/\lambda_r$
$\lambda_r$ = the resonant wavelength
$L_{ce}$ = the cavity length edge to edge
$\phi_r$ = the phase of the reflector reflection coefficient
$M_o$ = the mode number, (i.e., the number of half resonant wavelengths in the cavity)

We may further define the reflection coefficient as $|\Sigma_r| e^{i\phi_r}$ and the cavity velocity as $$V_c = f_r \lambda_r \quad (2)$$

If we permit the cavity to have sections having different velocities, $V_i$, then equation (1b) becomes:

$$\sum_{i=1}^{n} K_{ri} L_i - \phi_r = M_o \pi \quad (3)$$

where:

$$\sum_{i=1}^{n} L_i = L_{ce},$$

and
$n$ = the number of sections with different velocities. Utilizing equations (1b) and (2) to solve for resonant frequency $f_r$:

$$f_r = (V_c/2\pi L_{ce})(M_o \pi + \phi_r) \quad (4)$$

Thus, the reflection coefficient $\phi_r$ determines the resonant frequency for a given mode number, SAW velocity, and cavity length.

Figure 6A:
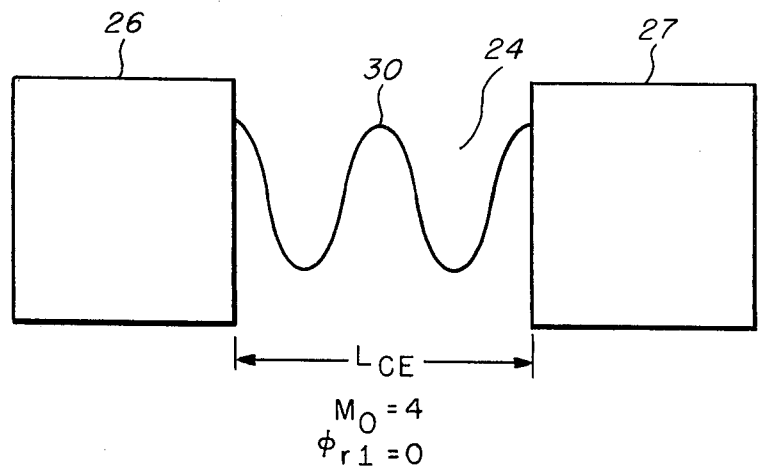
FIGS. 6A and 6B show a schematized SAW device and is useful in the explanation of the operation of the invention.
Figure 6B:
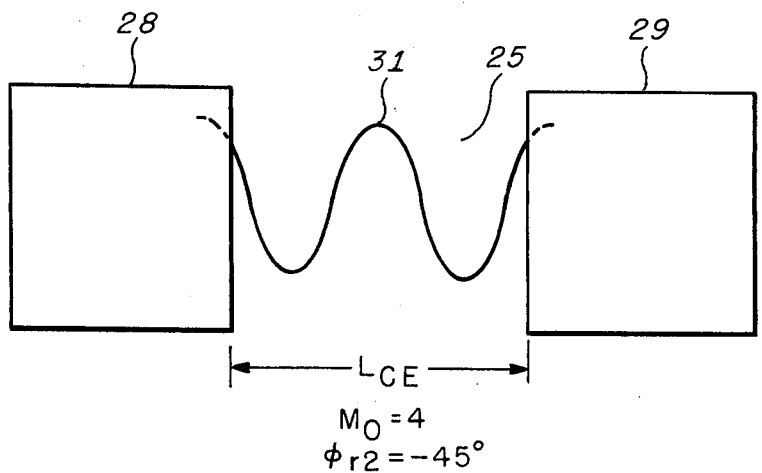

The physical reason for this can be understood by considering FIGS. 6A and 6B wherein two cavities 24 and 25 having equal length $L_{ce}$ and mode number (for example, $M_o = 4$), the first cavity being determined by reflectors 26 and 27 having a reflection coefficient phase of $\phi_{r1} = 0$, and the second cavity being determined by reflectors 28 and 29 and having a reflection coefficient phase of $\phi_{r2} \neq 0$, for example $-45$ degrees. Waveforms 30 and 31 are standing wave patterns for the two cavities, waveform 31 being stretched out compared to waveform 30 because of the different reflection phase coefficients. Since the velocities of surface acoustic waves in the two cavities are assumed equal, waveform 31 must therefore have a lower frequency than waveform 30. Thus, changing the reflection coefficient phase angle through the etching process changes $\phi_r$ and shifts the resonant frequency.

Figure 7:
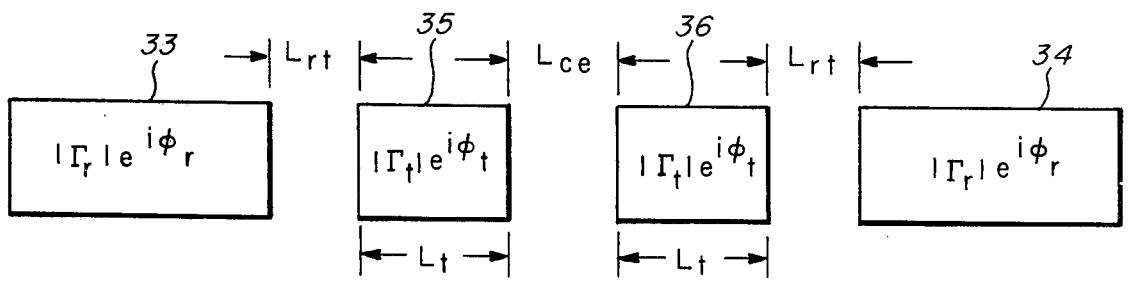
FIG. 7 shows a SAW device and is useful in the explanation of the operation of the invention.

Referring to FIG. 7, consider the case of a surface acoustic wave device cavity containing transducers 35 and 36. In the device of FIG. 7, reflectors 33 and 34 have identical reflection coefficients represented by the expression $|\Sigma_r| e^{i\phi_r}$, and transducers 35 and 36 have reflection coefficients represented by the expression $|\Sigma_t| e^{i\phi_t}$.

The reflectors in FIG. 7 are thus in actuality compound structures comprising reflectors 33 and 34, spaced at a distance $L_{rt}$ from transducers 35 and 36, which form the boundaries of a cavity 37 of length $L_{ce}$. The total reflection coefficient $|\Sigma_T| e^{i\phi_T}$ of this compound structure is:

$$|\Sigma_T| e^{i\phi_T} = (|\Sigma_r| e^{i\phi_r})(T_t^2 e^{i2K_{rt} L_{rt}}) + |\Sigma_t| e^{i\phi_t} \quad (5)$$

where: $T_t e^{iKL_{rt}}$ = the transducer transmission coefficient. For the purposes of explanation, we assume that the transmission coefficient is a constant $K^{\frac{1}{2}}$ and thus represent the reflection coefficient of the compound structure as:

$$|\Sigma_T| e^{i\phi_T} = K |\Sigma_r| e^{i\phi_r} + |\Sigma_t| e^{i\phi_t} \quad (6)$$

Figure 8:
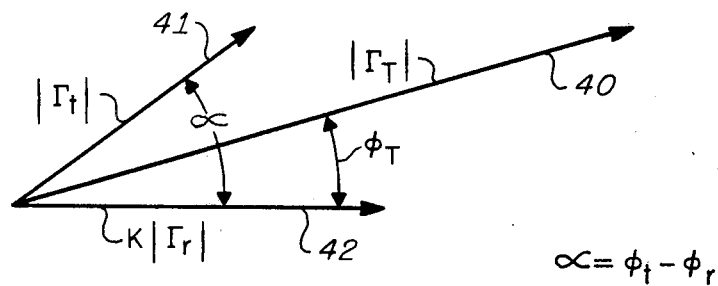
FIG. 8 is a vector diagram useful in explaining the operation of the invention.

Vector addition is used to determine the total amplitude and phase angle of the total reflection coefficient as shown in FIG. 8 where vector 40 is the total amplitude and phase shift reflection coefficient obtained by the vector addition of vectors 41 and 42, the angle between which is $\alpha = \phi_t - \phi_r$. Changes to either the magnitude or the phase angle of the transducer reflection coefficient will thus change $\phi_T$. It will be clear to those skilled in the art that changes to $\phi_T$ will change the resonant frequency $f_r$ as defined by equation (4), when $\phi_T$ replaces $\phi_r$ for the case of the compound structure. Both the magnitude and phase angle components are varied when the transducer's height relative to the substrate is changed, as in the trimming method shown by this invention.

In addition to causing changes in the reflection coefficient, changing device topology causes the surface acoustic wave velocity to be altered due to the phenomena well known in the art, of energy storage that occurs at discontinuities in the substrate surface. Such discontinuities 16, shown in FIG. 3, are created at the edges of electrodes 15. Energy storage occurring at such discontinuities results in a decrease of the surface wave velocity and changes the term $T_t$ in equation (5). Thus, the previously assumed constant K in equation (6) also changes as a result of the selective etching technique, and the change in resonant frequency is shown to be due to both a velocity change and a reflectivity change.

The height of the transducer relative to the substrate is altered using a differential or selective etching technique accomplished by fluorocarbon plasma etching. It has been found that such a technique permits a reduction in the device characteristic frequencies of up to 0.03% without degrading the device response characteristic. For the typical case wherein aluminum transducers and other structures such as reflectors, are deposited on a quartz substrate, the differential etch is accomplished by exposing the SAW device, mounted in its package without its lid, to a fluorocarbon plasma which is generated in an r.f. sputtering station or a plasma etcher. $CHF_3$ and $CF_4$ may be used to generate the plasma gas. $CF_4$ is preferred since, as will further be described below, $CHF_3$ causes a greater polymer accumulation. Other fluorocarbon compounds, however, or any other materials that selectively etch $SiO_2$ also work well.

When an r.f. sputtering station is used to generate the plasma, the SAW device is placed on the station's cathode, the backfill pressure is set to approximately 20 microns, and 20 watts of r.f. power is applied. This procedure produces an etching rate which changes the frequency of an 800 megahertz SAW resonator at a rate of 5 to 8 kilohertz per second of etch.

If the fluorocarbon plasma is generated in a plasma reactor rather than an r.f. sputtering station, the trimming method remains substantially the same. The same gas may be used to generate the etchant plasma when the backfill pressure of the gas is maintained at approximately 200 microns. The SAW device to be trimmed is placed in the reaction chamber of the plasma reactor and 100 watts of r.f. power is applied to generate the etchant plasma. The resulting rate of trim will be approximately 1/5 the rate provided by an r.f. sputtering station operated according to the previous description.

Those skilled in the art will appreciate that the quartz substrate is removed as a result of a process of chemical etching whether a plasma reactor or an r.f. sputtering station is used to generate the etchant plasma. Substrate material will also be removed due to the physical abrasion that results from the bombardment of the substrate by the high energy ions produced in the directional plasma generated in an r.f. sputtering station.

The use of a substantially pure fluorocarbon plasma as previously described will result in the accumulation of fluorocarbon polymers on the surface of the device being etched. Since such a build-up of polymer affects device operation and will cause high aging rates, the polymer should be removed or preferably, prevented from forming. The polymer can be readily removed after trimming, by exposure to a partial oxygen plasma. The polymer is prevented from forming by using a mixture of fluorocarbon gas and oxygen for the plasma during the trimming process. For best results, the mole fraction of $O_2$ should comprise from 0.05 to 0.25 of the gas mixture, the remaining portion of the mixture comprising the etchant gas. One mixture that has been found particularly useful is $0.85\ CF_4 + 0.15\ O_2$.

A method useful for increasing the characteristic frequency of SAW devices comprises placing the SAW device in a suitable oven and heating the device in its case, which may be opened or sealed, at a temperature in excess of 250° C. for a predetermined length of time. This method may be used to provide frequency increases of up to 0.01% without unacceptably degrading device response characteristics. The frequency increase results from an annealing of the aluminum that comprises the transducers or other structures, that occurs during the heating process.

Figure 9A:
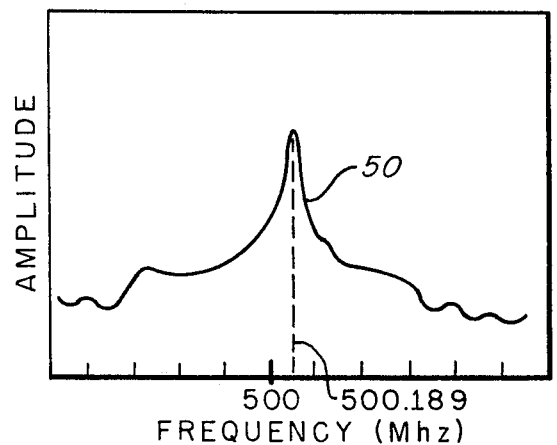
FIGS. 9A and 9B respectively show the frequency response of a SAW device prior to and after increasing the device's resonant frequency using the principles of the present invention.
Figure 9B:
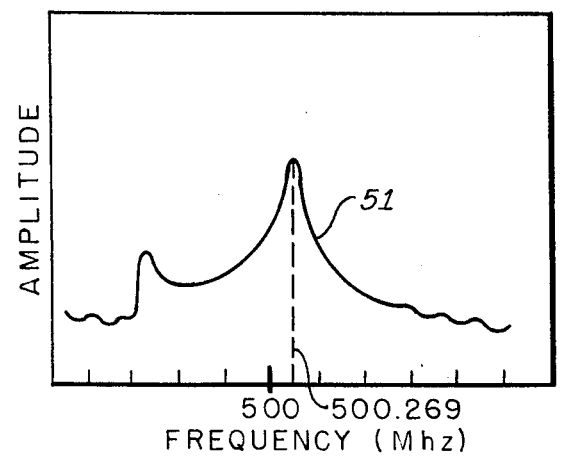

FIG. 9A shows the response of a SAW resonator, on quartz, that has aluminum transducers, prior to upward frequency trimming using the method of this invention. Waveform 50, representing the frequency response of the SAW resonator prior to trimming, shows peak amplitude response occurring at 500.189 megahertz. After heating the same SAW resonator 275° C. for 15 minutes, the response of the device changes as shown by waveform 51 of FIG. 9B wherein the frequency of the amplitude response peak has increased to 500.269 megahertz.

While the invention has been described in its preferred embodiments, it is to be understood that the words which have been used are words of description rather than of limitation, and that changes may be made within the purview of the appended claims without departure from the true scope and spirit of the invention in its broader aspects.

I claim:

1. A method for increasing the resonant frequency of surface acoustic wave devices of the type having a substrate fabricated from a first material about which structures fabricated from a second material are disposed, said method comprising heating said SAW device at a temperature in excess of 250° C. for a predetermined period of time.

2. The method according to claim 1 wherein said first material includes quartz and said second material includes aluminum.

* * * * *